United States Patent [19]

Copeland et al.

[11] Patent Number: 4,614,425

[45] Date of Patent: Sep. 30, 1986

[54] PHOTOGRAPHIC PRINTING METHOD AND APPARATUS

[75] Inventors: Harry J. Copeland, Springfield; John W. Powers, Battlefield, both of Mo.

[73] Assignee: Western Litho Plate & Supply Co., St. Louis, Mo.

[21] Appl. No.: 602,337

[22] Filed: Apr. 20, 1984

[51] Int. Cl.[4] .............................................. G03B 27/04
[52] U.S. Cl. ........................................ 355/99; 355/26
[58] Field of Search ........................ 355/26, 85, 99, 91

[56] References Cited

U.S. PATENT DOCUMENTS

| | | | |
|---|---|---|---|
| 3,385,193 | 5/1968 | Dougherty et al. | 355/26 X |
| 3,531,198 | 9/1970 | Delp | 355/26 |
| 3,635,559 | 1/1972 | Harrell et al. | 355/99 X |
| 3,689,153 | 9/1972 | Suzuki | 355/26 X |
| 4,353,647 | 10/1982 | Harrell et al. | 355/85 |
| 4,423,955 | 1/1984 | Powers | 355/99 |

OTHER PUBLICATIONS

Introduction of AXP System Automatic Double-Face Simultaneous Printed-Circuit Board Exposure, ORC Mfg., Co., Jun. 1982.

Primary Examiner—Richard A. Wintercorn
Attorney, Agent, or Firm—Senniger, Powers, Leavitt and Roedel

[57] ABSTRACT

A method of and apparatus for exposing boards which are photosensitive on both sides, for production of printed circuits on both sides, to light through films on both sides in which a lower film, a board, and an upper film in registered position on a light-transmitting platen are pressed down by a window and exposed to light on both sides through the platen and window, the window, gripping the upper film, is raised, the exposed board is removed, another board to be exposed is applied to the lower film on the platen, the window is lowered to apply the upper film to the new board, and the procedure repeated.

16 Claims, 15 Drawing Figures

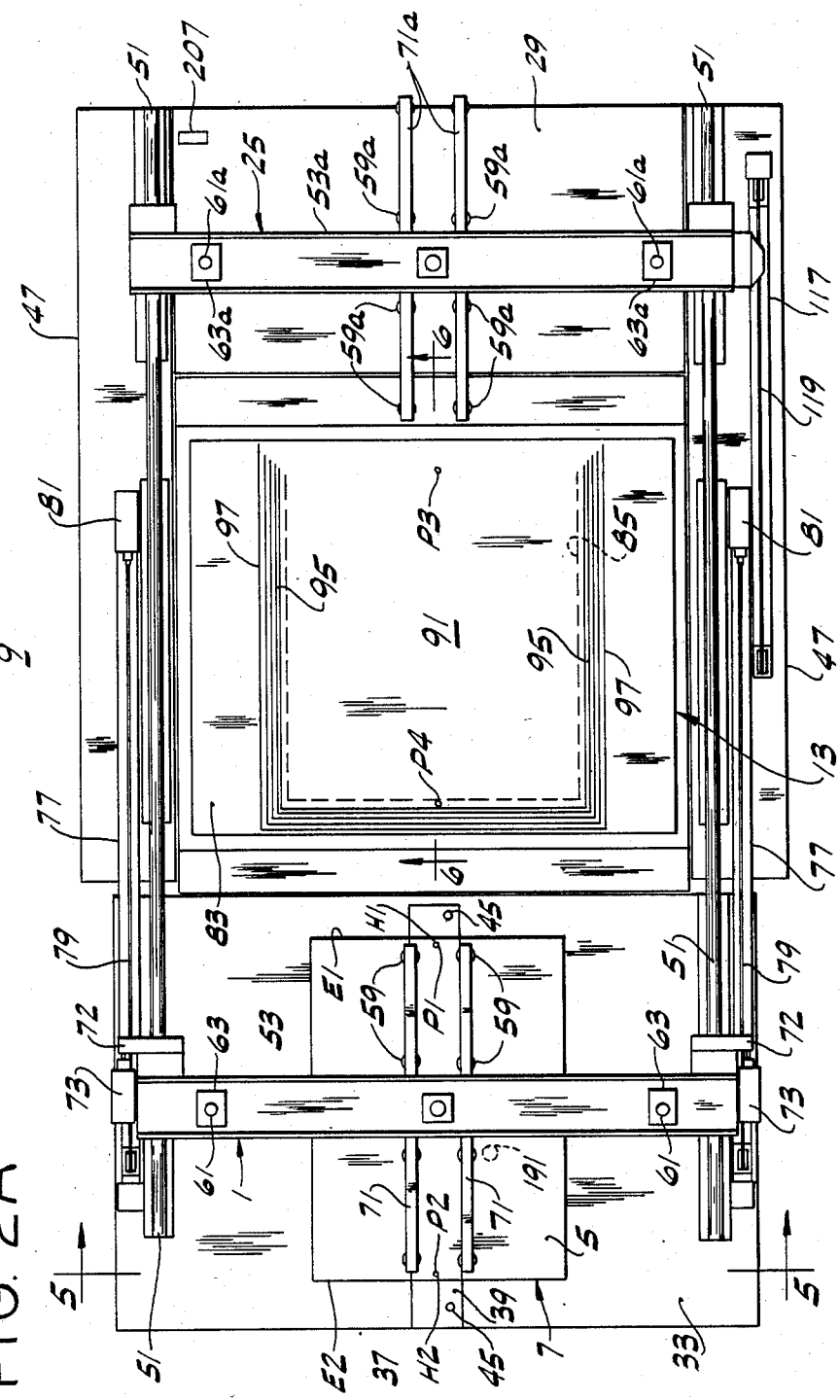

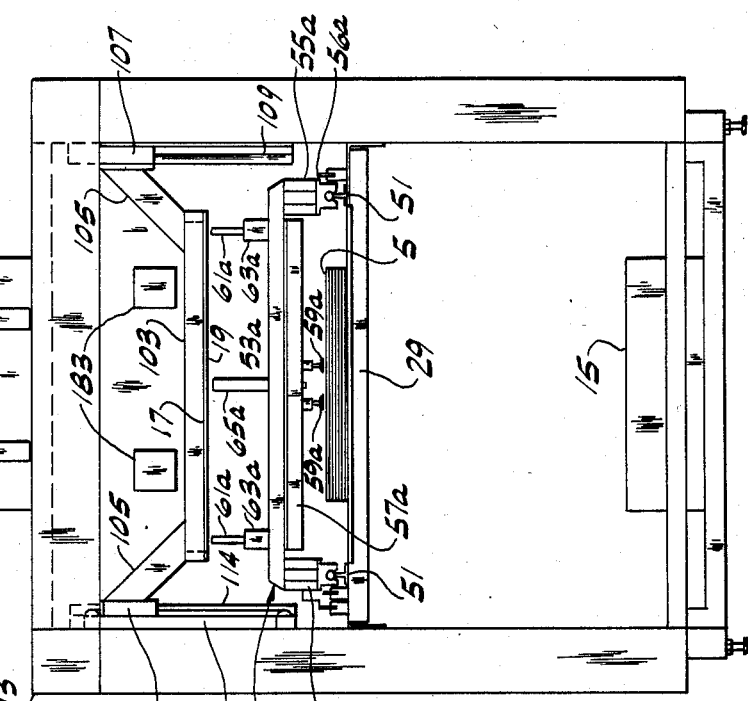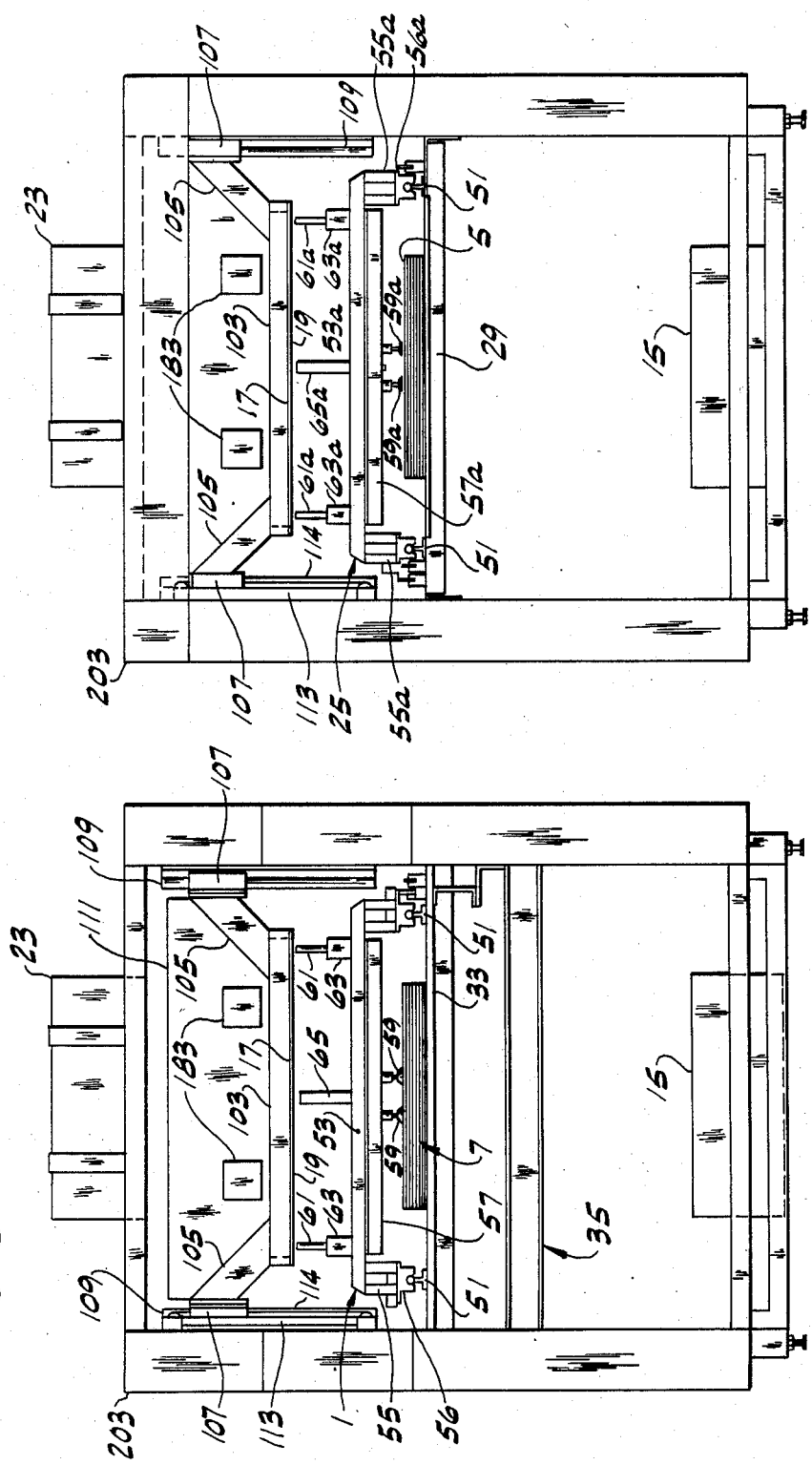

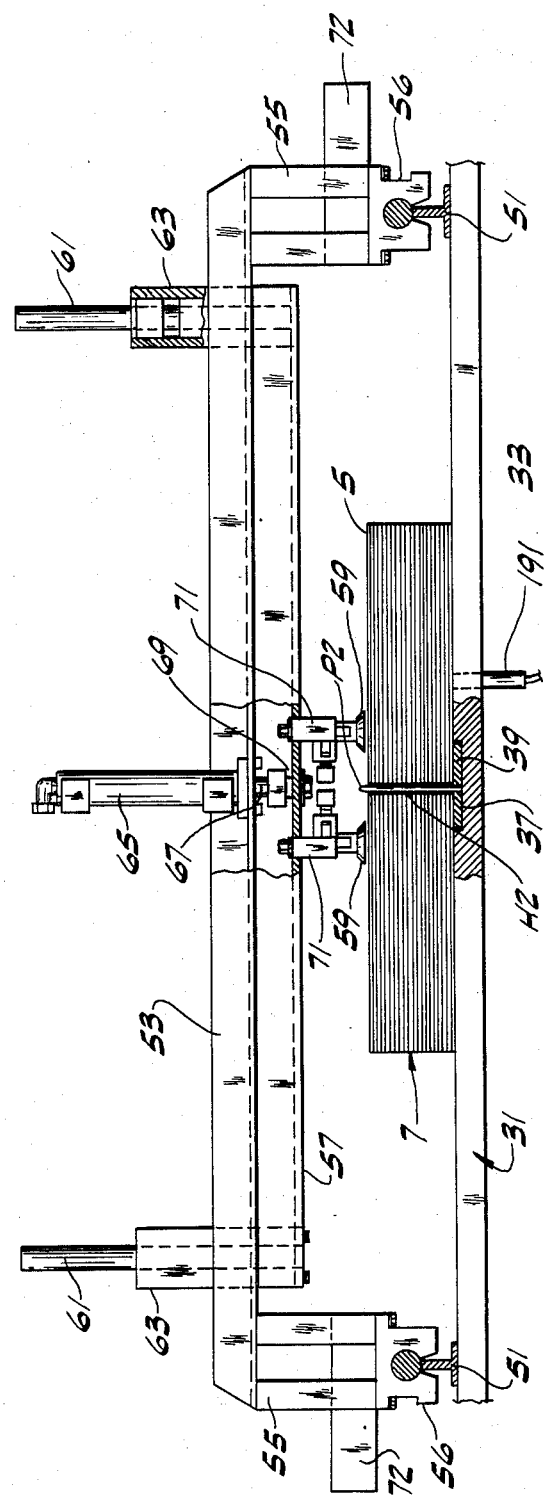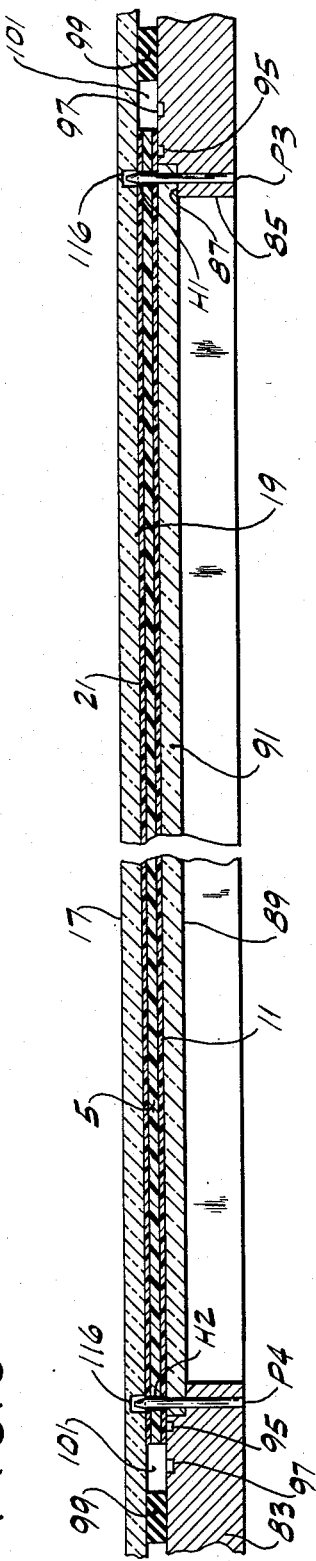

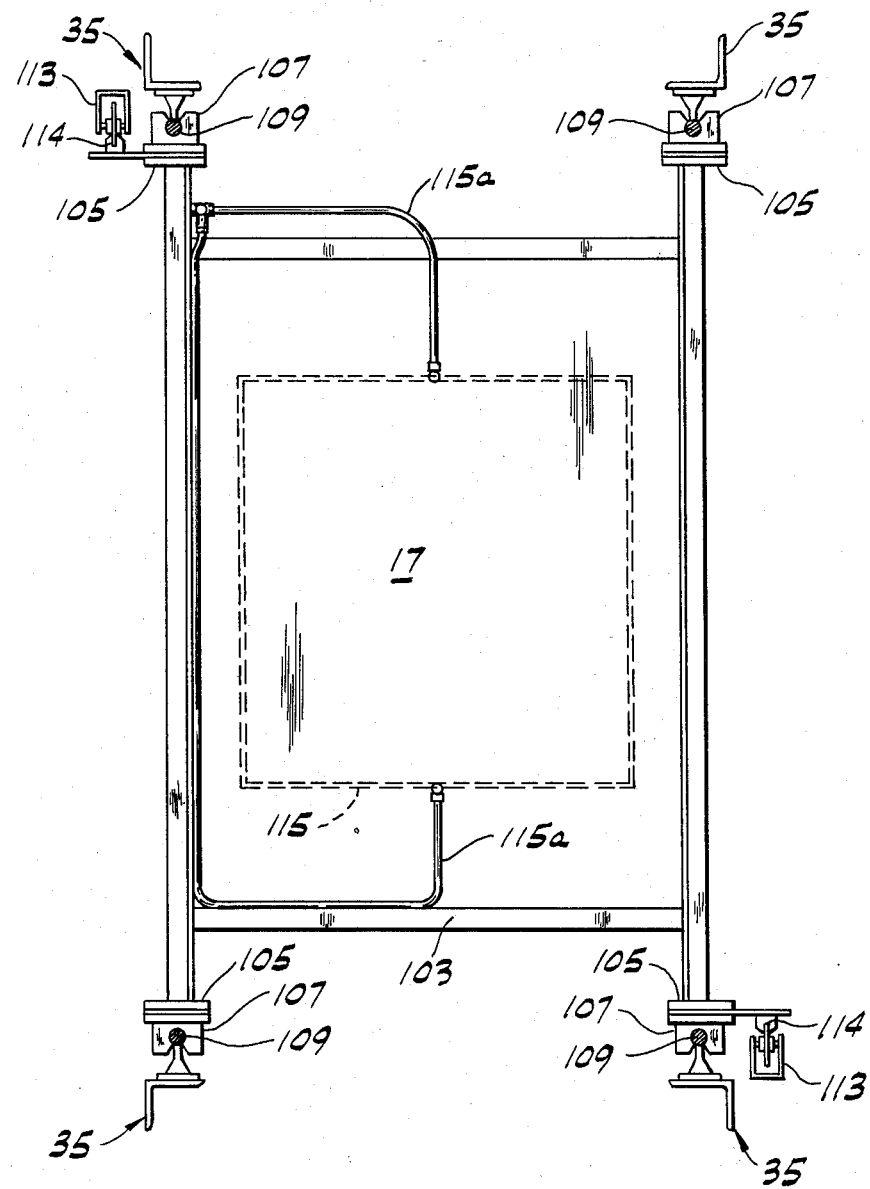

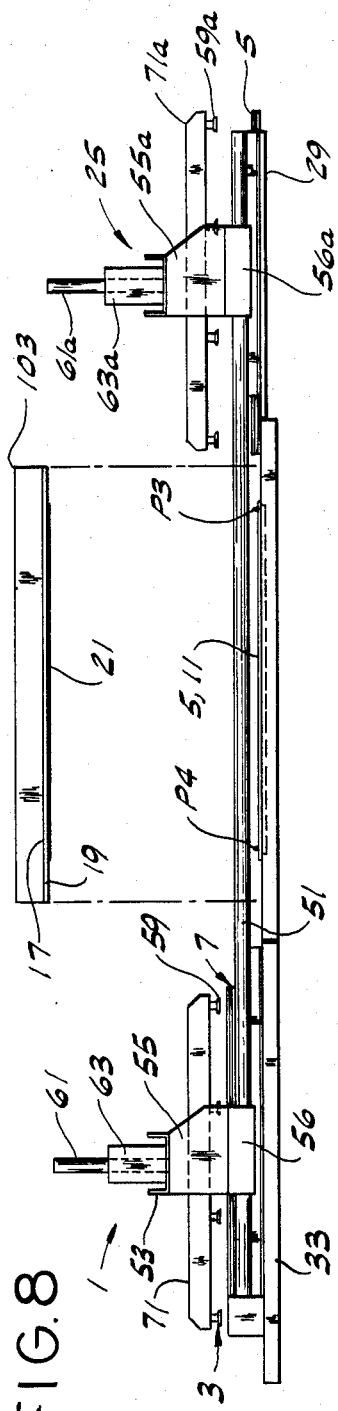

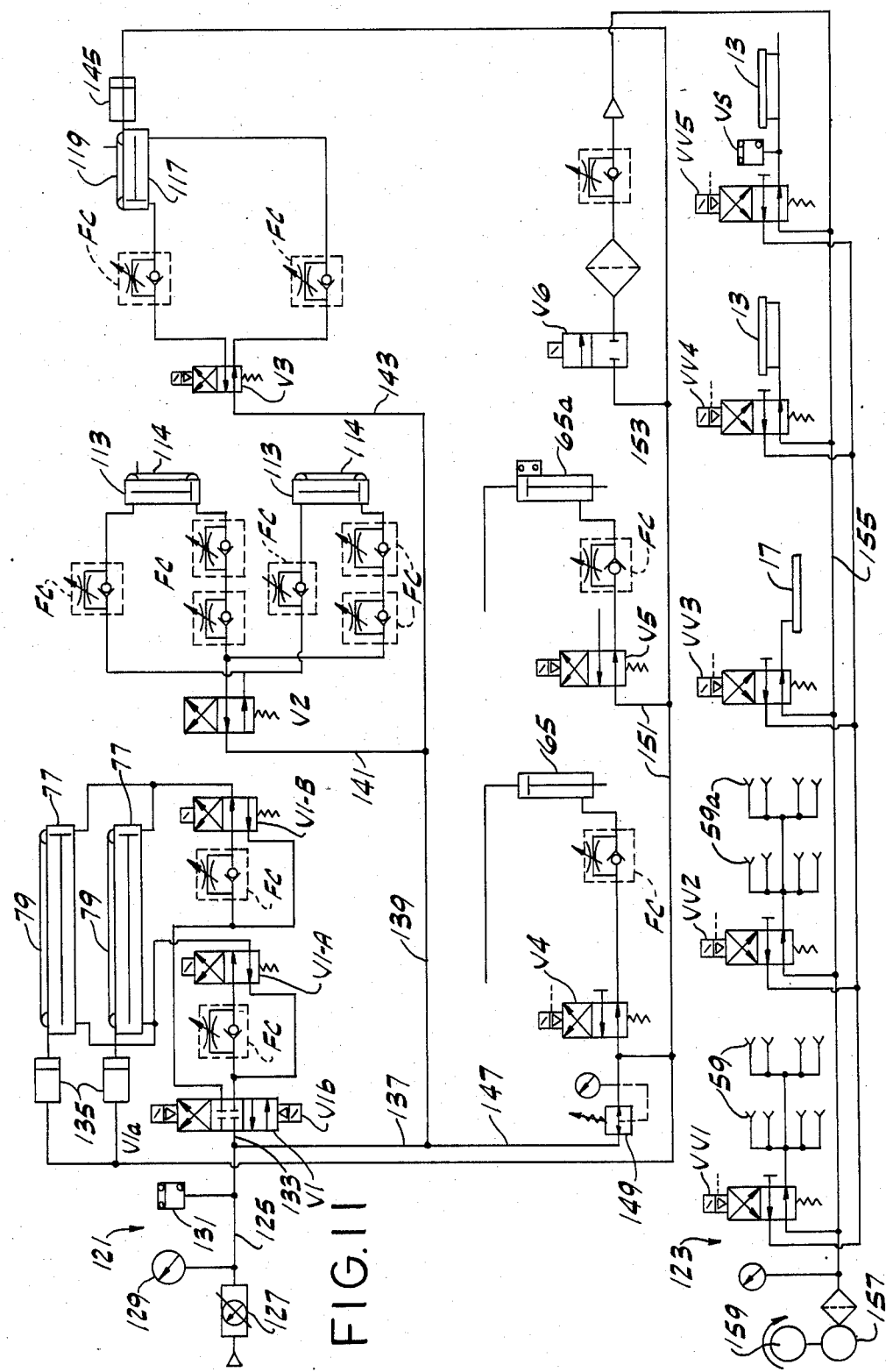

PHOTOGRAPHIC PRINTING METHOD AND APPARATUS

BACKGROUND OF THE INVENTION

This invention relates to photographic printing, and more particularly to methods of and apparatus for automatically carrying circuit boards which are to be photographically printed through exposure operations.

Reference may be made to the coassigned U.S. Pat. Nos. 3,635,559, 3,810,694 and 4,353,647 and U.S. patent application Ser. No. 362,515 filed Mar. 26, 1982, issued as U.S. Pat. No. 4,423,955, Jan. 3, 1984, for photographic printing methods and apparatus in the same general field.

SUMMARY OF THE INVENTION

Among the several objects of this invention may be noted the provision of a photographic printing methods and an apparatus of the same general type as disclosed in the above-noted patents and pending patent application particularly adapted for expeditiously handling circuit boards to be exposed for being photographically printed; and the provision of such a method and apparatus for simultaneously exposing both sides of a circuit board to light through two films.

In general, this invention is concerned with a method of and apparatus for exposing boards which are photosensitized on both sides, for production of printed circuits on both sides, to light through films on both sides, each film being imaged in a circuit pattern, the method comprising:

A. placing a first film through which one side of each of a plurality of boards are to be exposed in registered position on a light-transmitting support, B. placing a first board in registered position on the first film, C. placing a second film through which the other side of each board is to be exposed in registered position on said first board, D. bringing a window into engagement with the second film and pressing the second film, said first board and the first film together against the support, E. exposing one side of said first board to light through the support and the other side of said first board to light through the window, F. gripping the second film to the window and retracting the window, G. removing the exposed board, H. picking up the next board to be exposed from a stack of boards and bringing it into registered position on the lower film, I. moving the window with the second film gripped thereto to place the second film in registered position on said next board and to press the second film, said next board and the first film together against the support, J. exposing one side of said next board to light through the support and the other side of said next board to light through the window, and K. repeating steps F–J.

The apparatus comprises an exposure station at which a board is exposed to light through films on both sides, and means for holding in registered position a stack of boards to be exposed for delivery to the exposure station. At the exposure station is a light-transmitting platen for holding thereon a lower film, a board on the lower film and an upper film on the board in registered position, and a window movable from a raised position above the platen to a lowered position for engagement of the lower face of the window with the upper film for pressing the upper film, the board and the lower film together against the platen. The window has means associated therewith for holding said upper film on its lower face. Means operable with the window raised delivers a board from the stack to the exposure station and applies it to a lower film on said platen in its said registered position. Means is provided for exposing the board at the exposure station to light through the two films. Means operable with the window raised removes the exposed board from the exposure station while retaining the lower film on the platen and the upper film on the lower face of the window.

Other objects and features will be in part apparent and in part pointed out hereinafter.

BRIEF DESCRIPTION OF THE DRAWINGS

FIG. 3 is and end elevation of the apparatus as viewed from the left end of FIG. 1, with parts broken away;

FIG. 4 is an end elevation as viewed from the right end of FIG. 1, with parts broken away;

FIG. 5 is an enlarged section on line 5—5 of FIG. 2;

FIG. 6 an enlarged section on line 6—6 of FIG. 2;

FIG. 7 is a plan generally on line 7—7 of FIG. 1 showing the upper window at the exposure station of the apparatus;

FIG. 8 is view in side elevation on a larger scale than FIG. 1 showing both the delivery carriage and the discharge carriage of the apparatus in their home positions;

FIG. 9 is a view similar to FIG. 8 showing the discharge carriage moved from its home position to the exposure station;

FIG. 10 is a view similar to FIG. 8 showing the delivery carriage moved from its home position to the exposure station;

FIG. 11 is a diagram of the pneumatic (compressed air and vacuum) circuitry of the apparatus.

Corresponding reference characters indicate corresponding parts throughout the several views of the drawings.

DESCRIPTION OF THE PREFERRED EMBODIMENT

Figure 1:
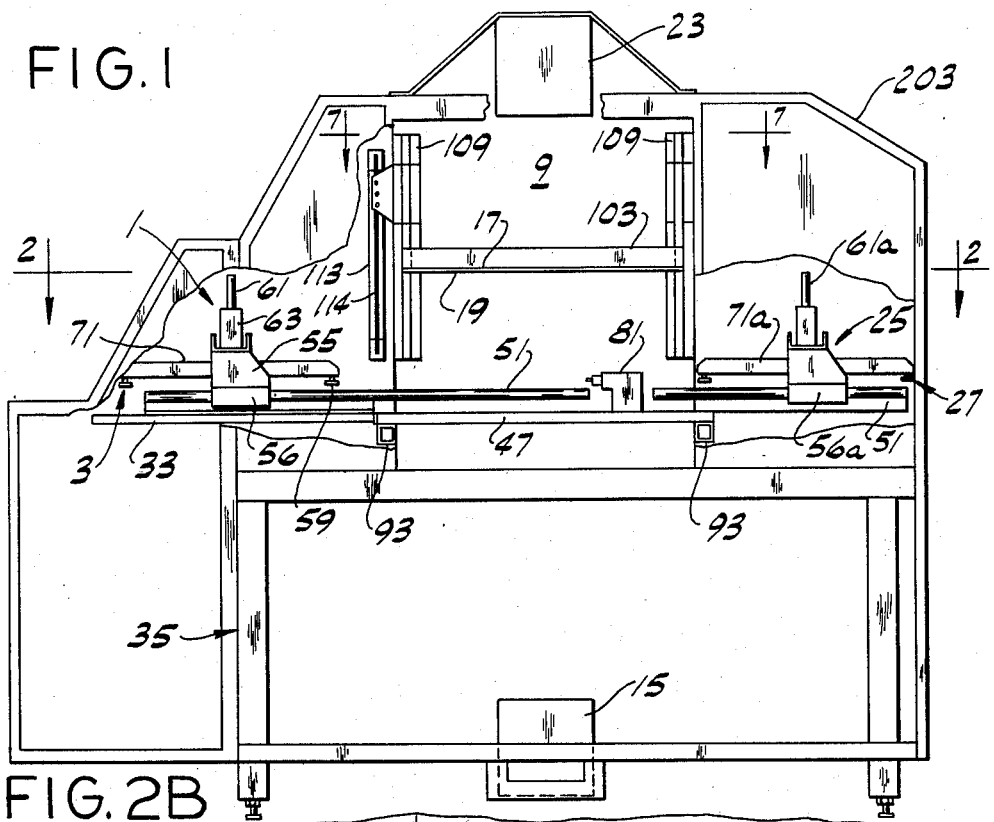
FIG. 1 is a side elevation of an apparatus of this invention, a housing of the apparatus being broken away.

The invention is herein described as it relates to exposing photosensitized boards which are to be processed into printed circuit boards. It will be understood that such a photosensitized board typically comprises a base of electrical insulation, generally a plastic material, having a layer of electrically conductive material, e.g., copper foil, on each side and a coating of photosensitive acid-resist material on each conductive layer, for being processed into what is called a double-side printed circuit board. In processing such a board photosensitized on both sides, for the production of printed circuits on both sides, each side thereof is exposed to light through a mask or film imaged in a circuit pattern according to the circuit to be provided on the respective side of the board, the exposed board being subsequently processed in a manner well known in the art including etching areas of the electrically conductive material to provide the requisite circuit pattern on each side of the board.

This invention involves a method of and apparatus for the double-side exposure of such boards. Referring to the drawings, the apparatus of this invention is shown to comprise a first carriage generally designated 1, which may be referred to as the infeed or delivery or loader carriage, having vacuum gripper means 3 for picking up a board 5, which is photosensitized on both sides and which is to be exposed on both sides, from a supply stack 7 of the boards 5, this carriage being moveable forward (toward the right as viewed in FIGS. 1, 2 and 8–10) to carry the pickedup board forward (downstream) to an exposure station 9 and deposit it in registration on a first film 11 (the "lower film") at the exposure station. This first or lower film 11 is manually placed and held in a fixed, predetermined registered position on a platen 13 at the exposure station, the board being deposited by the carriage 1 on this film and registered therewith, for exposure of the bottom side of the board through the film by energizing a light source 15 below the platen.

Above the platen 13 is an upper light-transmitting panel or window 17 adapted (as will be made clear) to hold on its bottom face 19 in registered position a second film 21 (the "upper film") through which the top side of the board is to be exposed. This upper window 17, carrying the upper film 21, is movable downwardly from a raised retracted position spaced a sufficient distance from the platen 13 for entry of the carriage 1 carrying a board 5 between the window and the platen to a lowered exposure position for pressing the upper film 21 (gripped to the bottom face 19 of the window 17), the board 5 and the lower film 11 thereunder down against the platen. Above the upper window is a light source 23 for exposing the upper side of the board to light through the upper window 17 and the upper film 21. A second carriage 25, which may be referred to as the outfeed or discharge or unloader carriage, has vacuum gripper means 27 for gripping the board 5 which has been exposed on both sides at the exposure station, and is movable between a retracted or "home" position forward of (downstream from) the exposure station back over the board at the exposure station, the upper window 17 being open, and then, having picked up the exposed board, is movable forward out of the exposure station to remove the exposed board and deliver it to receiving means 29 forward of the exposure station.

The apparatus comprises means indicated generally at 31 at what may be called the stack-holding station for holding stack 7 of the photosensitized boards 5 to be exposed. The boards are rectangular. Each has a registration hole H1 adjacent one edge E1 of the board and a registration hole H2 adjacent the opposite edge E2, these edges being the leading and trailing end edges of the board in relation to its path of travel through the apparatus. The registration holes are in the center line of the board which extends from end edge E1 to end edge E2. The lower and upper films 11 and 21 have corresponding registration holes, also designated H1 and H2, and may be wider than the boards 5. Means 31 comprises a table 33 formed by a rectangular table top plate mounted in horizontal position on the frame 35 of the apparatus at a convenient height for placement of the stack of boards on the table by an operator standing at the rearward or entry (upstream) end of the apparatus. The platen 13 is mounted on the frame 35 forward of the table 33 with its upper surface generally flush with the upper surface of the table.

The table 33 has a groove 37 in the top extending generally centrally thereof longitudinally of the apparatus. This groove receives what may be called a board stack magazine plate 39 having a first registration pin P1 adjacent one end constituting its leading or forward end and a second registration pin P2 adjacent its trailing or rearward end adapted for reception in the registration holes H1 and H2 of the boards to hold them in a registered position relative to the magazine plate. The magazine plate is adapted for placement thereon of a stack 7 of boards 5 while removed from the table 33, and for placement with the stack thereon in the groove 37 in the table, thereby expediting placement of stacks on the table. The magazine plate is adapted to be secured in registered position in the groove with the boards registered by pins P1 and P2 relative to the apparatus by means of thumbwheel screws 45 adapted to be threaded down into tapped holes in the table.

The frame 35 of the apparatus has horizontal rail supports 47 extending forward from the forward edge of the table 33 at table top level along both sides of the platen 13 and extending forward beyond the forward edge of the platen 13 on opposite sides of a forward table structure constituting the exposed board receiving means 29 which spans the frame forward of the platen 13. Guide rails 51 extend longitudinally of the apparatus adjacent its left and right sides on the table 33 and the rail supports 47, these rails extending forward from the table 33 on opposite sides of the platen 13 and the forward table 29.

The carriage 1 comprises an elongate channel-section bridge member 53 mounted at its ends on supports 55 on guide bushings 56 slideable on the left and right side guide rails 51, the bridge member 53 extending transversely of the apparatus at an elevation above the table 33. Vacuum gripper means 3 comprises a crossbar 57 carrying downwardly facing vacuum suction cups 59 movable up and down below the bridge member 53 for picking up the top board of the stack 7. The crossbar is mounted for up and down movement by means of guide rods 61 extending up from the crossbar adjacent its ends through holes in the bridge member 53 and through ball bushings 63 mounted on the bridge member, and is adapted to be driven up and down by means of an air cylinder 65 mounted on the bridge member at the center of its length, the piston rod 67 of the air cylinder extending down through a hole in the bridge member to a connection at 69 with the crossbar. The latter carries two vacuum cup bars each designated 71 extending at right angles thereto, i.e., longitudinally of the apparatus, forward and rearward of the crossbar, the vacuum cups 59 being mounted at intervals along the length of these vacuum cup bars.

Figure 2B:
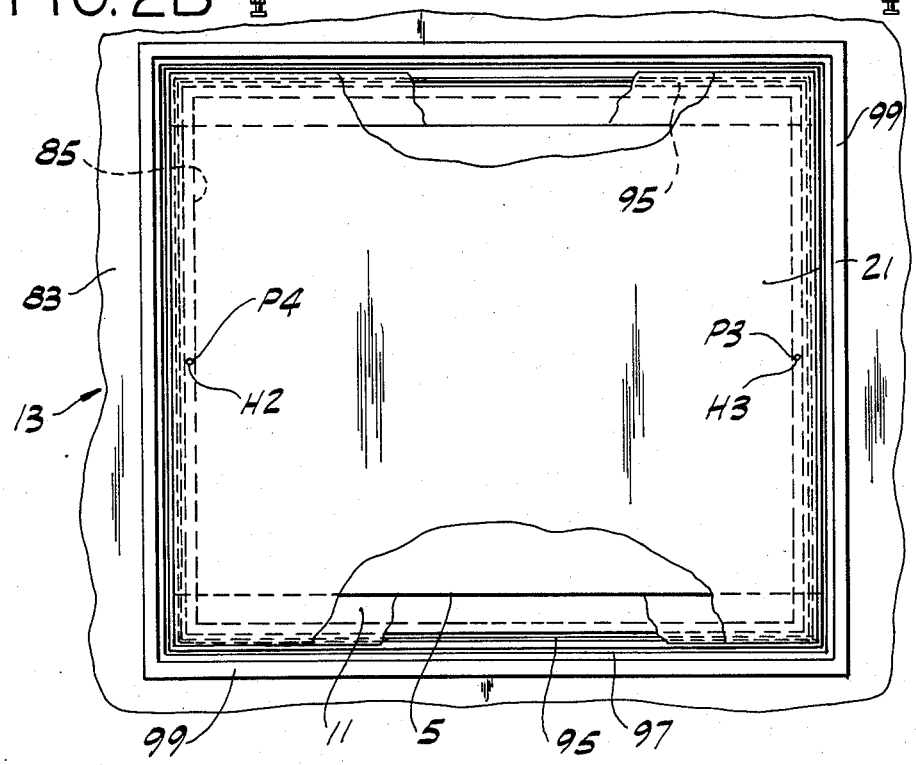
FIG. 2 is a plan of the apparatus with parts broken away, the view being generally on line 2—2 of FIG. 1.
FIG. 2A is an enlarged fragment of FIG. 2, with parts broken away.

The carriage 1 is movable forward from the retracted board pickup or "home" position over the stack in which it is shown in FIGS. 1, 2, 8 and 9, determined by engagement of lugs 72 on the carriage with stops 73, to the exposure station 9 and rearward back to its retracted position by means indicated generally at 75 and comprising a pair of air-operated cable cylinders each designated 77, one at the left and the other at the right, the cables 79 of these cylinders being suitably attached to the carriage (see FIG. 2). These cylinders are operable to move the carriage forward to what may be called its board registration position in the exposure station illustrated in FIG. 10, determined by engagement of the carriage lugs with a pair of stops each designated 81, one at the left and the other at the right. In the board registration position, a board 5 gripped by the vacuum cups 59 of the carriage has its registration holes H1 and H2 aligned with registration pins P3 and P4 extending up from the platen 13.

The platen 13 comprises a relatively thick rectangular metal (aluminum) plate 83 having a rectangular window opening 85 therein with a groove or rabbet 87 all around the opening at the top. Set into the opening 85 and bearing on the shoulder 89 at the bottom of the rabbet is a transparent light-transmitting window pane 91, e.g. a transparent glass pane. The plate 83, which in effect constitutes a window frame for the window pane 91, is mounted at its forward and rearward ends on crossbeams 93 of the frame of the apparatus, spanning these beams, the arrangement being such as to allow for projection of light from the light source 15 up through the window pane 91. Plate 83 has two vacuum grooves 95 and 97 in the top extending all around the window pane 91. Groove 95 is the inner and 97 the outer of these grooves. Surrounding the outer groove 97 is a compressible seal 99 constituted, for example, by a strip of suitable rubber, engageable by the upper window 17 when it is lowered. The inner vacuum groove 95 is for vacuum-gripping the lower film 11 on the platen 13. The outer vacuum groove 97 is for drawing a vacuum in the space 101 between the upper window 17 and the platen 13 when the upper window is moved down into engagement with the seal to force the window, with upper film 21 held on its bottom face 19 as will appear, down into pressurized engagement with the board 5 and the lower film 11 and on the platen, the seal being compressed as this occurs.

At the exposure station 9, forward of (downstream from) the stack holding means or station 31, the upper window 17 (e.g. of transparent plastic) is movable downwardly toward and upwardly away from the platen 13, being mounted in horizontal position on the bottom of an open rectangular window frame 103 having corner brackets 105 carrying guide bushings 107 slideable on vertical rails 109 mounted on the frame 35 of the apparatus above the four corners of the platen 13. Suitable light shielding may be provided as indicated at 111 in FIG. 3. The window frame 103 carrying window 17 is movable up and down by means of a pair of air-operated cable cylinders each designated 113 at two diagonally opposite corners of the window frame, the cables 114 of these cylinders being attached to the guide bushings 107 at the respective corners. For gripping the upper film 21 on its lower face 19, the window 7 has a set of vacuum grooves 115 in its lower face, flexible vacuum lines 115a being connected thereto for drawing a vacuum in this set of grooves. It also has pockets indicated at 116 in FIG. 6 for receiving the upper ends of the registration pins P3 and P4 when it is lowered.

The second carriage 25 is essentially identical to the first carriage 1, its parts being designated by the same numerals as applied to the parts of the carriage 1 with the suffix a. Its guide bushings 56a are slideable on rails 51 (like the guide bushings 56 of carriage 1). It is movable rearward from its forward or home position forward of the exposure station 9 in which it is illustrated in FIGS. 1, 2 and 8, when the upper window 17 is raised, to the rearward board pickup position in which it is illustrated in FIG. 9 between the platen 13 and the raised window 17, and forward back to its home position, by means shown as comprising an air-operated cable cylinder 117, the cable 119 of this cylinder being suitably attached thereto (see FIG. 2).

The apparatus has an air system 121 and a vacuum system 123 as shown in FIG. 11, the air system having a line 125 for supplying compressed air to the apparatus including a pressure regulator 127, a pressure gauge 129 and a pressure switch 131. Line 125 feeds a line 133 including a solenoid valve VI controlling a pneumatic circuit including solenoid deceleration valves VI-A and VI-B for the two delivery carriage cylinders 77. Flow controls are indicated at FC. Tension cylinders for tensioning the cables 79 of cylinders 77 are indicated at 135. Valve VI, as indicated in FIG. 11 has two coils VIa and VIb and the system is such that when VIb is energized, the delivery carriage 1 is moved rearward to its retracted or pickup position of FIGS. 1, 2, 8 and 9 (its home position) and when VIa is energized, the delivery carriage is moved forward. Valve VI-A acts to decelerate the carriage as it approaches its forward board registration position at the exposure station 9, and valve V1-B acts to decelerate the carriage toward the end of its return to its pickup or home position.

Line 125 feeds lines 137 and 139 and a line 141 feeding a solenoid valve V2 controlling a pneumatic circuit for cylinders 113 for raising and lowering the upper window 17, the window being raised when the valve V2 is deenergized and lowered when it is energized.

Line 139 also feeds a line 143 feeding a solenoid valve V3 controlling the discharge carriage cylinder 117. A tension cylinder 145 for the cable 119 of cylinder 117 is indicated at 145. When valve V3 is deenergized, the discharge carriage 25 is moved to its forward (home) position of FIGS. 1, 2, 8 and 10, and when it is energized the carriage moves to its rearward position at the exposure station 9.

Line 137 feeds a line 147 which includes a pressure regulator 149 for feeding a solenoid valve V4 controlling the cylinder 65 for raising and lowering the vacuum cups 59 of the delivery carriage 1. When valve V4 is deenergized, these cups are moved up and vice versa.

Line 147 via regulator 149 feeds a line 151 connected to a solenoid valve V5 for raising and lowering the vacuum cups 59a of the discharge carriage 25. When valve V5 is deenergized, these cups are moved up and vice versa.

The air system 121 is interconnected via a circuit indicated at 153 including a solenoid valve V6 with the vacuum system 123 for the purpose of quickly relieving vacuum in the vacuum system.

The vacuum system 123 has a vacuum line 155, in which a vacuum is drawn by a vacuum pump 157 driven by a motor 159, interconnected with vacuum solenoid valves VVI-VV5. Valve VVI controls vacuum for the loader carriage cups 59. Valve VV2 controls vacuum for the unloader carriage cups 59a. Valve VV3 controls vacuum for the vacuum groove 115 in the bottom of the window 17. Valve VV4 controls vacuum for the film-grip vacuum groove 95 in the platen 13. And valve VV5 controls vacuum for the vacuum groove 97 in the platen, the system here including a vacuum switch VS.

Figure 12A:
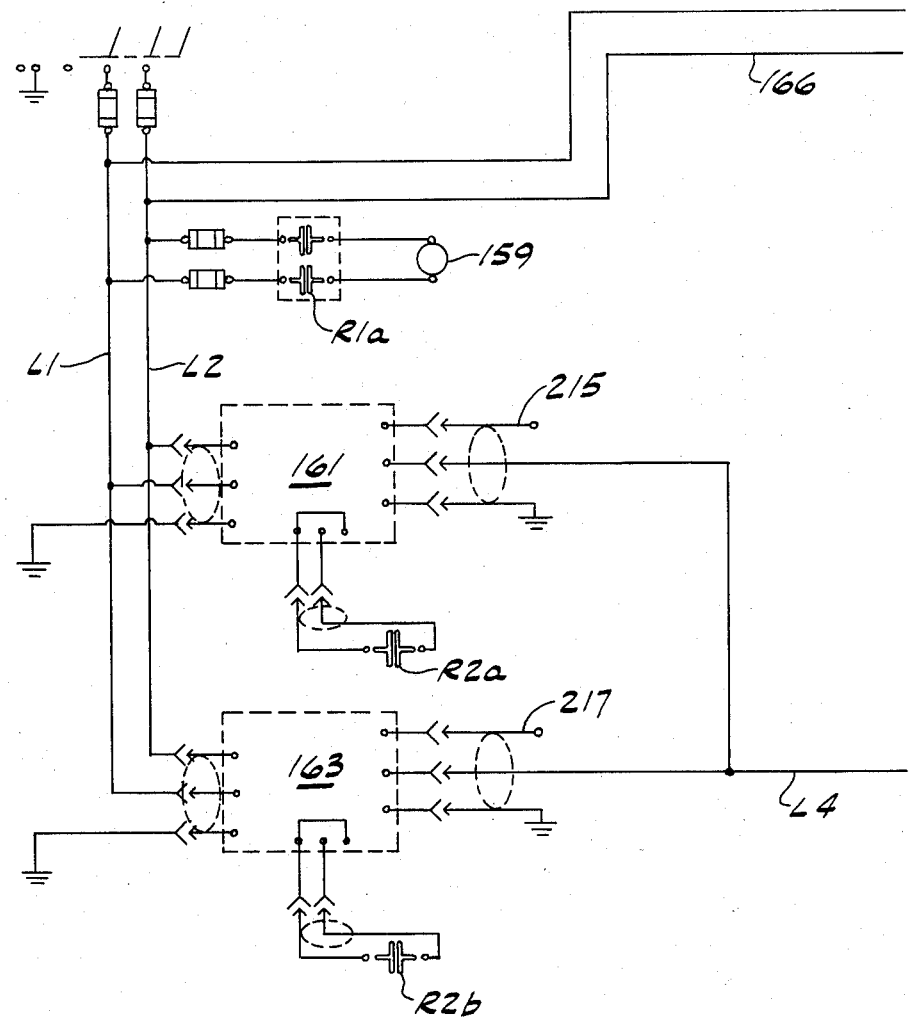
FIGS. 12A and 12B together constitute a first electrical circuit diagram.
Figure 12B:
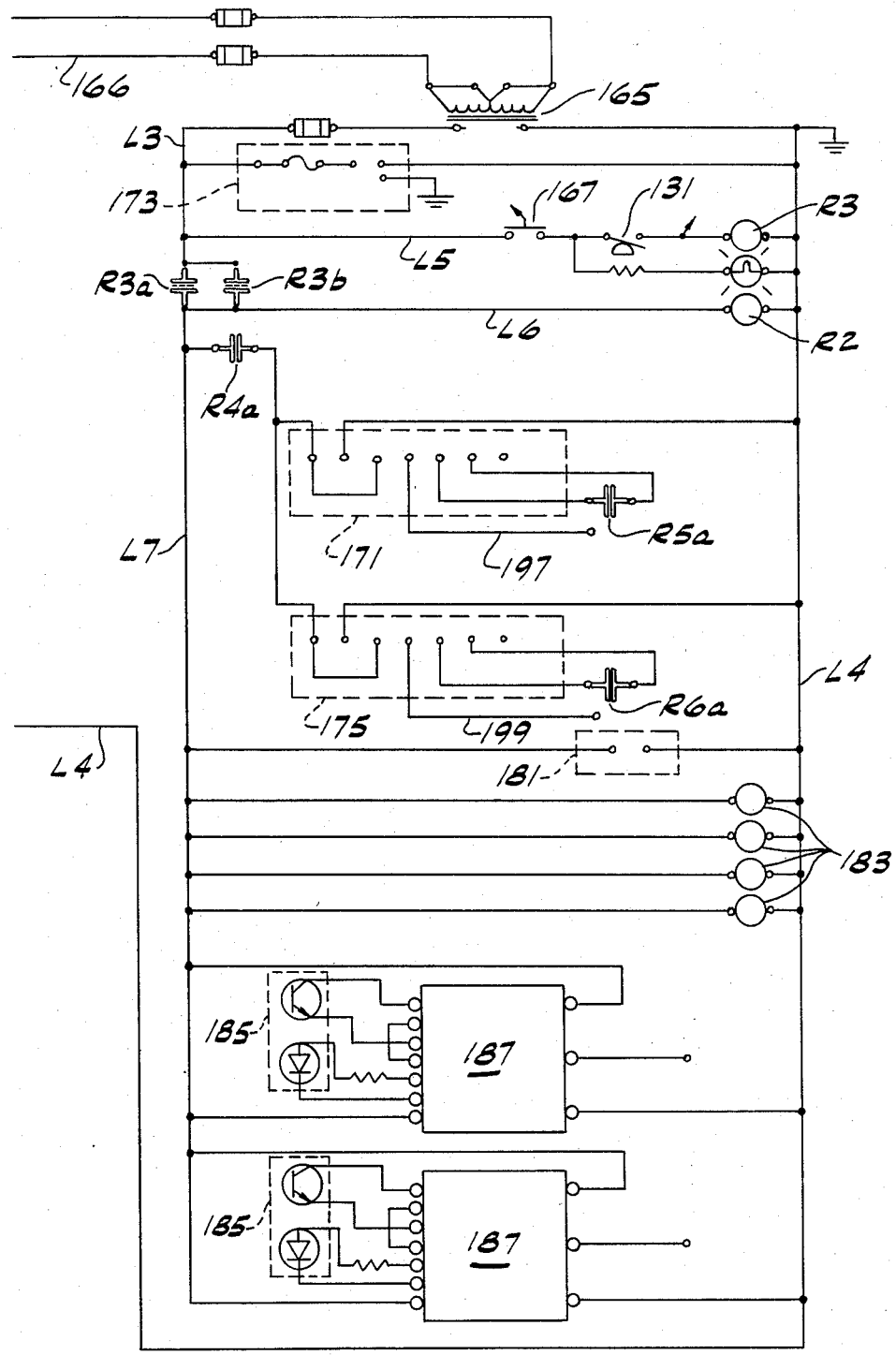
Figure 13:
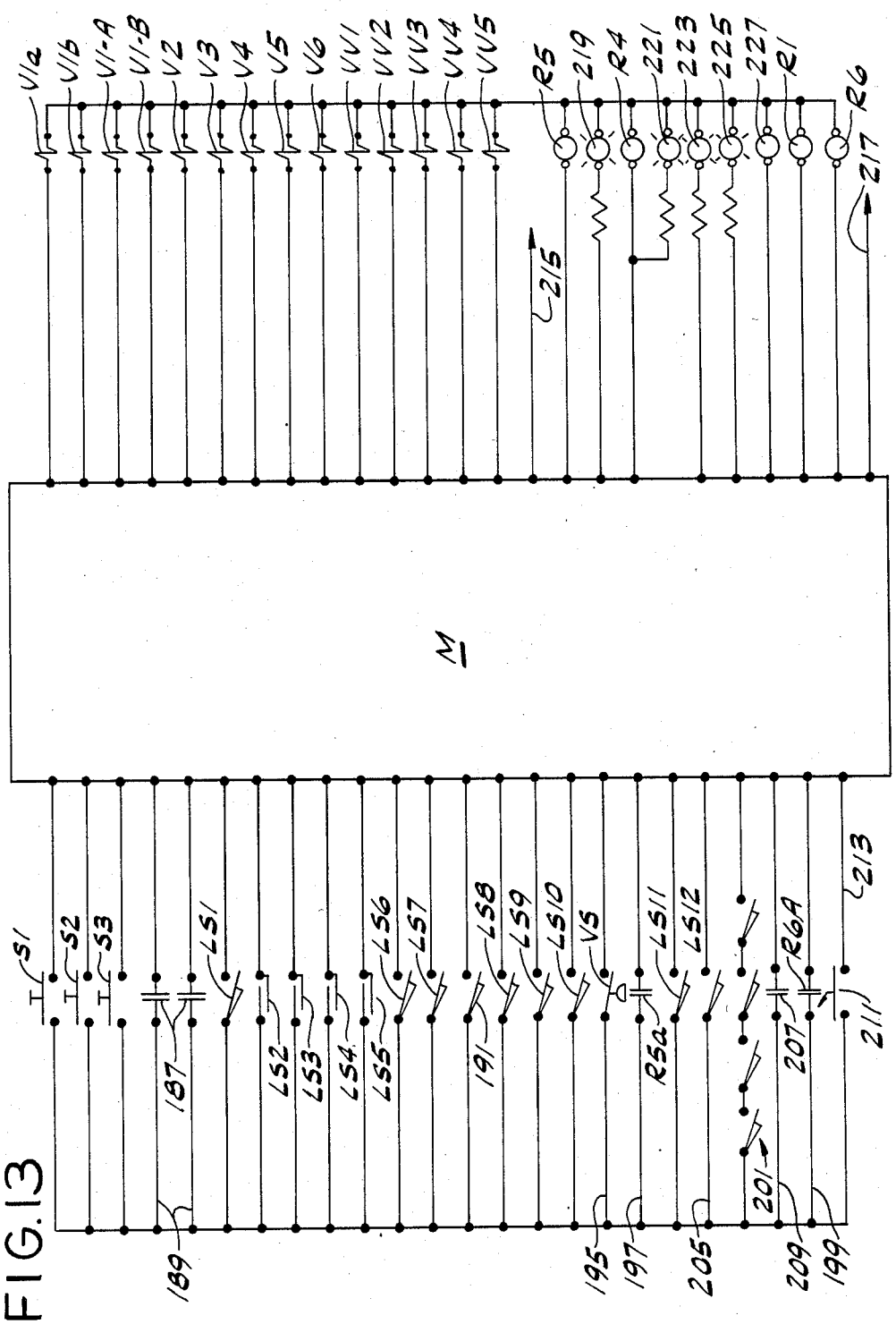
FIG. 13 is a second electrical circuit diagram.

Referring to FIGS. 12A and 12B, main power supply lines for the apparatus are indicated at L1 and L2. The motor 159 (FIG. 13) for driving the vacuum pump 157 is connected across these lines under control of contacts R1a of a relay R1 (FIG. 12B). Power supply systems 161 and 163 for the upper and lower lamps 23 and 15 are powered via lines L1 and L2, under control of contacts R2a and R2b of a relay R2. Lines L3 and L4 are connected to the secondary of a transformer 165 powered from lines L1 and L2 as indicated at 166. A control switch 167 (an on-off switch) is connected in series with pressure switch 131 and a control relay R3 in a line L5 across lines L3 and L4. Relay R2 is connected in a line L6 fed by contacts R3a and R3b. Contacts R3a when closed also feed a line L7. An integrator 171 for the upper lamp 23 is connected across lines L7 and L4 in a circuit including contacts R4a of relay (see Fig. 13). The upper lamp is turned on under control of integrator 171 on closure of contacts R5a of a relay R5 (FIG. 13). Similarly, an integrator 175 for the lower lamp 15 is connected across lines L7 and L4 in the circuit including contacts R4a. The lower lamp is turned on under control of integrator 175 on closure of contacts R6a of a relay R6 (see FIG. 13). These integrators are identical, each being of a standard commercially available type adapted on initiation of its operation to integrate light falling on it and to turn off the respective lamp power supply system 161, 163 for the respective lamp when the amount of light reaches a value (set by adjustment of the integrator) needed for proper exposure of the board. At 179 (FIG. 12B) is indicated a power supply system for a microcomputer M (FIG. 13) connected across lines L3 and L4. At 181 is indicated a wiring arm for the microcomputer connected across lines L7 and L4. Blowers such as indicated at 183 on the shielding on the upper window 17 are connected across lines L7 and L4. Photosensors such as indicated at 185 are provided for sensing the presence and correct registration of boards on platen 13 in the exposure station 9, control units 187 for these photosensors being connected across lines L7 and L4.

The microcomputer M is programmed for operation of the apparatus as hereinafter described. Manually operable (push button) switches S1, S2 and S3 and limit switches LS1–LS12 are connected in input lines to the microcomputer as illustrated. S1 is a start or "Process" switch. S2 is a stop ("Cancel") switch. S3 may be referred to as the "Load Plate" switch, being operable to drive carriage 1 forward from its retracted pickup or home position to clear the table 33 for applying magazine plate 39 with a 7 stack of boards 5 thereon to the table. LS1 is a delivery carriage pickup (home) position limit switch operable by the carriage 1 as, in moving rearward (upstream), it reaches its pickup (home) position. LS2 is an upper limit switch and LS3 is a down limit switch for the carriage 1 vacuum bars 71 carrying vacuum cups 59. LS4 and LS5 are up and down limit switches for the carriage 25 vacuum bars 71a carrying vacuum cups 59a. LS6 is a carriage 1 forward or exposure station registration position limit switch operable by carriage 1 as, in moving forward, it reaches that position. LS7 and LS8 are deceleration limit switches for effecting deceleration of carriage 1 as it approaches its home and exposure station registration positions, respectively. LS9 and LS10 are up and down limit switches for the upper window 17. LS11 and LS12 are exposure station and home position limit switches, respectively, for the carriage 25. The photosensor control units 187 are connected as indicated in FIG. 13 in input lines 189 to the microcomputer M. At 191 is indicated a sensor for sensing absence of boards at the stack-holding station connected in a microcomputer input line 193.

Vacuum switch VS is connected in a microcomputer input line 195. Contacts R5a and R6a for the integrators 161 and 163 are connected in microcomputer input lines 197 and 199. Switches indicated at 201 are door interlock switches for doors of housing 203 of the apparatus, connected in microcomputer input line 205. A photosensor 207 for sensing discharge stack height is connected in a microcomputer input line 209. A one-side/two-side selection switch 211 is connected in a microcomputer input line 213.

Referring to FIG. 13, coils V1a and V1b of air valve V1, deceleration valves V1-A and V1-B, air valves V2-V6 and vacuum valves VV1-VV5 are all connected in output lines from the microcomputer M to line L4. Microcomputer output lines 215 and 217 are connected to the power supply systems 161 and 163 for the upper and lower lamps 23 and 15 for controlling the latter in response to the integration of light by the integrators 171 and 175. Relays R1, R4, R5 and R6 are connected in output lines from the microcomputer M to line L4. An "empty magazine" signal lamp 219, a "process" signal lamp 221, a "load position" signal lamp 223, a "full stack" signal lamp 225 and an "empty magazine/full stack" audible alarm signal 227 are connected in microcomputer output lines for operation as will appear.

Operation is as follows:

For the description of the operation of the apparatus, it will be assumed that at the start of the operation, there are no boards or films in the apparatus, the loader carriage 1 is back in its retracted board pickup or home position of FIGS. 1, 2 and 8 with its vacuum cups 59 raised, and the unloader carriage 25 is forward (downstream) in its discharge or home position of FIGS. 1, 2 and 8 with its vacuum cups 59a raised. The upper window 17 is raised.

Control switch 167 is turned on and, with air pressure in line 125 and pressure switch 131 thereby closed, relay R3 is energized and its contacts R3a and R3b are closed so that relay R2 is energized via line L6 and its contacts R2a and R2b are closed to turn on the lamp power systems 161 and 163, which are allowed time to warm up. With contacts R3a closed, a circuit for line L7 is completed.

The operator manually places a lower film 11 in registered position on the platen 13, registering it by means of platen pins P3 and P4, received in the registration holes H1 and H2 of the lower film, then places a first board 5 to be exposed in registered position on the lower film, registering the board by means of pins P3 and P4, received in the registration holes H1 and H2 in the board, and then places an upper film 21 in registered position on top of the board, registering it by means of pins P3 and P4, received in the registration holes H1 and H2 of the upper film. It will of course be understood that a sandwich consisting of a lower film, a board, and an upper film may be assembled and applied to the pins as a unit, rather than applying each separately to the pins. Photsensors 187 sense proper placement of the films and board on the platen.

Having placed the lower film 11, board 5 and upper film 21 on the pins P3 and P4 at the exposure station, the operator actuates the "Load Plate" switch S3, which results via the microcomputer M in energization of coil V1b for actuation of valve V1 to operate air cylinders 77 to drive carriage 1 forward to its forward position at the exposure station 9 corresponding to the position in which it is illustrated in FIG. 10, but without carrying a board 5, thus clearing the table 33 for application thereto of magazine plate 37 carrying a stack 7 of boards 5 to be processed, with the boards registered on the pins P1 and P2 extending up from the plate through the registration holes H1 and H2 in the boards. The plate 37, carrying the stack 7, is placed in the groove 37 in the top of the table and fastened in place (in registered position) by means of the thumbwheel screws 45. Sensor 191 thereupon senses the presence of boards in proper position at the stack-holding stations.

Now, with the lower film 11, board 5 and the upper film 21 in registered position on the platen 13 at the exposure station ready for exposing the board on both sides to light from lamps 15 and 23 through the films, and with the supply of boards 5 on table 33 at the stack-holding station, the operator actuates the start or "Process" switch S1, and the operation proceeds through the following steps:

1. Relay R1 is energized via the microcomputer M and its contacts R1a close to energize the vacuum pump motor 159 to draw vacuum in the vacuum system 123, and relay R4 is energized to supply power to the integrators 171 and 175.

2. Coil V1b of the valve V1 is energized via the microcomputer to actuate air cylinders 77 to return the carriage 1 to its board pickup position (its retracted of home position) of FIGS. 1, 2 and 8). As it approaches its pickup position, it actuates the deceleration limit switch LS7, energizing the deceleration valve V1-B to slow the carriage down. The slowed-down carriage 3 is stopped at the pickup position by engagement of carriage lugs 72 with the stops 73, and as it reaches this position it actuates the limit switch LS1.

3. On actuation of limit switch LS1, valve V2 is energized via the microcomputer M, to actuate air cylinders 113 to lower the window 17, which moves down into engagement with the seal 99 and presses it down to seal off space 101. As the window comes down into engagement with the seal, it actuates limit switch LS10.

4. On actuation of limit switch LS10, vacuum valve VV5 is energized via the microcomputer to draw a vacuum in the microcomputer to draw a vacuum in the space 101, the window 17 then being forced down by atmospheric pressure to squeeze down the film/board/film sandwich on the platen 13. Vacuum valves VV3 and VV4 are energized via the microcomputer to draw a vacuum in the vacuum groove 115 in the bottom face 19 of window 17 for gripping the upper film 21 on the bottom face of the window, and to draw a vacuum in the vacuum groove 95 in the platen 13 for gripping the lower film 11 down on the platen.

5. Vacuum is drawn in space 101 for a suitable interval (e.g. ten seconds) after reaching a suitable level (e.g. 25" Hg.) and vacuum switch VS is actuated to energize relays R5 and R6 via the microcomputer to close contacts R5a and R6a for energizing the upper and lower lamps 23 and 15 from the lamp power supply systems 161 and 163 under control of the integrators 171 and 175. With the lamps on, the lower face of the board 5 at the exposure station 9 is exposed to light through the platen window pane 91 and the lower film 11, and the upper face of the board is exposed to light through the upper window 17 and the upper film 21. Vacuum is continuously drawn during the exposure, the time of which is determined by the integrators 171 and 175, and which may be varied in accordance with the photosensitive acid-resist material on the board.

6. When the lamps 23 and 15 are extinguished, valve V6 is energized via the microcomputer to inject a short blast of air via groove 97 into the space 101 to release the upper window 17 to allow it to rise. Vacuum is maintained in groove 95 to grip the lower film 11 to the platen 13 and in groove 115 to grip the upper film 21 to the upper window 17.

7. On extinguishing the lamps and the injection of air into the space 101, valve V2 is deenergized with resultant actuation of air cylinders 113 to raise the window 16 with the upper film 21 vacuum-gripped to the bottom face 19 of the window. The lower film 11 remains gripped (by vacuum) to the platen 13, and the now-exposed board 5 remains on the lower film. As the window 17 reaches its upper position, it actuates limit switch LS9 and stops.

8. On actuation of limit switch LS9, valve V3 is energized via the microcomputer to actuate air cylinder 117 to drive the unloader carriage 25 rearward (upstream) to its board pickup position above the exposed board 5 in the exposure station 9, as shown in FIG. 9. As it reaches the stated pickup position, it actuates limit switch LS11 and comes to a stop.

9. On actuation of limit switch LS11, valves V4 and V5 are energized via the microcomputer to actuate air cylinder 65 and 65a to drive down the vacuum cup bars 71 of the loader carriage 1 and the vacuum cup bars 71a of the unloader carriage 25. Bars 71 move down to bring the loader carriage vacuum cups 59 into engagement with the top board 5 of the stack 7 at the stack-holding station, and bars 71a move down to bring the unloader carriage vacuum cups 59a into engagement with the exposed board 5 at the exposure station 9. As the bars 71 move down, limit switch LS3 is tripped; as the bars 71a move down, limit switch LS5 is tripped.

10. On actuation of limit switch LS3, valve VV1 is energized via the microcomputer to draw vacuum in the loader vacuum cups 59 so that they vacuum grip the top board 5 of the stack 7 at the stack-holding station.

11. On actuation of limit switch LS5, valve VV2 is energized via the microcomputer to draw vacuum in the unloader vacuum cups 59a so that they vacuum grip the exposed board 5 at the exposure station.

12. Valves V4 and V5 are deenergized and vacuum cups 59 and 59a move up, lifting the board next to be exposed and the just-exposed board. When the cups are raised, limit switches LS2 and LS4 are tripped.

13. Coil V1a of valve V1 is energized via the microcomputer and valve V3 is deenergized to actuate air cylinders 77 to move the loader carriage 1 carrying the picked-up board 5 next to be exposed to the exposure station 9 and simultaneously to move the unloader carriage 25 carrying the just-exposed board 5 from the exposure station to the unloading station at 29. As the loader carriage 1 approaches its registration position at the exposure station (FIG. 10), it actuates the deceleration limit switch LS8, energizing the deceleration valve V1-A to slow the carriage down. The slowed-down carriage 1 is stopped at the registration position by engagement of the carriage lugs 72 with the stops 81, and as it reaches this position it actuates limit switch LS6. As the unloader carriage 25 reaches its retracted (home) position (shown in FIG. 10), it actuates limit switch LS12.

14. On actuation of limit switches LS6 and LS12, valves V4 and V5 are energized via the microcomputer to drive the vacuum bars 71 and 71a carrying vacuum cups 59 and 59a down. As the bars are moved down, limit switches LS3 and LS5 are actuated, resulting in deenergization of vacuum valves VV1 and VV2 to cut off vacuum in the vacuum cups to release the new board to be exposed in registered position on the pins P3 and P4 on top of the lower film 11 (which was left on the platen 13) and to release the exposed board on the table 29.

15. Valves V4 and V5 are then deenergized, and vacuum bars 71 and 71a return to their reaised position, with resultant tripping of limit switches LS2 and LS4.

16. Coil V1b of valve V1 is energized via the microcomputer to actuate air cylinders 79 to return carriage 1 to its pickup position (FIGS. 1, 2 and 8) as in step 1. The unloader carriage 25 remains in its home position.

This completes a first cycle of operation of the apparatus. The lower film 11 remains in registered positon on the platen 13 (registered by means of the pins P3 and P4). A fresh board to be exposed is in registered position (registered by means of the pins P3 and P4) on the lower film. The window 17, now in raised position, carries gripped to its bottom face 19 (gripped by vacuum in groove 115) the upper film 21, the latter being in registered position relative to the board 5, the lower film 11 and the pins P3 and P4 at the exposure station 9 by reason of having been previously registered on the pins, and picked up by window 17 without disturbing its registration.

The apparatus continues in operation in cycles involving steps 3–16 as above described until the supply of boards 5 to be exposed (stack 7) is exhausted or until the stack of exposed boards on table 29 reaches a predetermined height (e.g. three inches). Exhaust of the supply is sensed by the sensor 191. When it senses this, it acts via the microcomputer to cut off further cycling of the apparatus until the supply is replenished. It also acts via the microcomputer to energize the empty magazine signal lamp 219 and alarm 227. Sensors 185 act to cut off operation of the apparatus if there is no board at the exposure station or if it is not properly registered. Sensor 207 acts via the microcomputer to cut off operation of the apparatus when the output stack of exposed boards on table 29 reaches a predetermined maximum height (e.g., three inches) and acts to energize the "full stack" signal lamp 225 and the alarm 227.

In view of the above, it will be seen that the several objects of the invention are achieved and other advantageous results attained.

As various changes could be made in the above constructions and methods without departing from the scope of the inventions, it is intended that all matter contained in the above description or shown in the accompanying drawings shall be interpreted as illustrative and not in a limiting sense.

What is claimed is:

1. The method of exposing boards which are photosensitive on both sides, for production of printed circuits on both sides, to light through films on both sides, each film being imaged in a circuit pattern, said method comprising the steps of:
    A. placing a first film through which one side of each of a plurality of boards are to be exposed in registered position on a light-transmitting support,
    B. placing a first board in registered position on the first film,
    C. placing a second film through which the other side of each board is to be exposed in registered position on said first board,
    D. bringing a window into engagement with the second film and pressing the second film, said first board and the first film together against the support,
    E. exposing one side of said first board to light through the support and the other side of said first board to light through the window,
    F. gripping the first film to the support and the second film to the window, then retracting the window,
    G. removing the exposed board,
    H. picking up the next board to be exposed from a stack of boards and bringing it into registered position on the lower film,
    I. moving the window with the second film gripped thereto to place the second film in registered position on said next board and to press the second film, said next board and the first film together against the support,
    J. exposing one side of said next board to light through the support and the other side of said next board to light through the window, and
    K. repeating steps F–J.

2. The method of claim 1 wherein the first film, the first board and the second film are placed in registered position on said support by registering them on pins on said support extending through registration holes in said films and board.

3. The method of claim 1 wherein the second film is vacuum gripped to the window.

4. The method of claim 1 wherein the first film is vacuum gripped to the support.

5. The method of claim 4 wherein the second film is vacuum gripped to the window.

6. The method of claim 1 wherein the next board is brought into its registered position on the first film simultaneously with the removal of the exposed board.

7. Apparatus for exposing boards which are photosensitized on both sides, for production of printed circuits on both sides, to light through films on both sides, each film being imaged in a circuit pattern, said apparatus comprising:
    an exposure station at which a board is exposed to light through films on both sides,
    means for holding in registered position a stack of boards to be exposed for delivery to the exposure station,
    said apparatus having at the exposure station a light-transmitting platen for holding thereon a lower film, a board on the lower film and an upper film on the board in registered position,
    a window movable from a raised position above the platen to a lowered position for engagement of the lower face of the window with the upper film for pressing the upper film, the board and the lower film together against the platen,
    said window having means associated therewith for holding said upper film on its lower face,
    means operable with the window raised for delivering a board from the stack to the exposure station and applying it to a lower film on said platen in its said registered position,
    means for exposing the board at the exposure station to light through the two films, and
    means operable with the window raised for removing the exposed board from the exposure station while retaining the lower film on the platen and the upper film on the lower face of the window.

8. Apparatus as set forth in claim 7 wherein the means for holding the stack of boards to be exposed comprises a support for the stack having registration pins extending upwardly therefrom which are received in registration holes in the boards.

9. Apparatus as set forth in claim 7 wherein the means for holding the stack of boards to be exposed comprises a fixed support and stack-holding magazine means removably secured in predetermined position on the fixed support, said magazine means having registration pins extending upwardly therefrom which are received in registration holes in the boards.

10. Apparatus as set forth in claim 9 wherein the fixed support is a table having a groove therein and the magazine means comprises a plate received in the groove, with means for removably securing the plate in predetermined position in the groove.

11. Apparatus as set forth in claim 7 wherein the means for holding the stack of boards to be exposed comprises a support for the stack having registration pins extending upwardly therefrom which are received in registration holes in the boards, the platen having registration pins extending upwardly therefrom which are received in registration holes in the lower film, the registration holes in the board thereon and registration holes in the upper film on the board.

12. Apparatus as set forth in claim 11 wherein the means for holding said upper film on the lower face of the window is a vacuum grip means.

13. Apparatus as set forth in claim 12 further having vacuum grip means for gripping the lower film on the platen.

14. Apparatus as set forth in claim 13 having a compressible seal for compression between the window and the platen when the window is lowered to seal a space between the window and the platen, and means for evacuating said space.

15. Apparatus as set forth in claim 14 wherein the means for delivering a board from the stack to the exposure station and applying it to a lower film on the platen at the exposure station in said registered position comprises a carriage movable forward from a retracted position over the stack to the exposure station, board gripper means movable up and down on the carriage adapted to grip the top board of the stack, means for operating the carriage and the board gripper means when the carriage is in retracted position to pick up a board from the stack, to move the carriage to a position at the exposure station wherein the board is adapted to be lowered to its said registered position on the lower film on the platen, to lower the board gripper means and release the board to deposit it in registered position on the lower film, and then to raise the board gripper means and return the carriage to retracted position.

16. Apparatus as set forth in claim 15 wherein the means for removing the exposed board from the exposure station comprises a second carriage movable from a discharge position outside the exposure station to a board pickup position over an exposed board at the exposure station, gripper means on the second carriage movable up and down on the second carriage, and means for operating the second carriage and associated gripper means to move the second carriage to its said pickup position, lower the associated gripper means and actuate it to grip the board, raise it to lift the board, and then move the second carriage forward to its forward position and deactuate the associated gripper means to release the board.

* * * * *